United States Patent
Jung et al.

(10) Patent No.: US 9,151,972 B2
(45) Date of Patent: Oct. 6, 2015

(54) DISPLAY PANEL AND METHOD OF MANUFACTURING THE SAME

(71) Applicant: Samsung Display Co., Ltd., Yongin (KR)

(72) Inventors: Jin-Soo Jung, Hwaseong-si (KR);
YongHwan Shin, Yongin-si (KR);
Young Gu Kim, Hwaseong-si (KR);
Byoung-Hun Sung, Hwaseong-si (KR);
Junwoo Lee, Seongnam-si (KR);
BaekKyun Jeon, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 158 days.

(21) Appl. No.: 13/755,394

(22) Filed: Jan. 31, 2013

(65) Prior Publication Data

US 2014/0104528 A1    Apr. 17, 2014

(30) Foreign Application Priority Data

Oct. 17, 2012 (KR) ......................... 10-2012-0115546

(51) Int. Cl.
*C09K 19/00* (2006.01)
*G02F 1/1333* (2006.01)
(Continued)

(52) U.S. Cl.
CPC ...... *G02F 1/133305* (2013.01); *G02F 1/13452* (2013.01); *H01L 33/08* (2013.01); *G02F 1/133345* (2013.01); *Y10T 428/10* (2015.01); *Y10T 428/1059* (2015.01)

(58) Field of Classification Search
CPC ................... G02F 1/133305; G02F 1/133308; G02F 1/133345; G02F 1/13345; G02F 1/133452; G02F 1/136286; G02F 2001/133357; G02F 2001/136295; G02F 2001/133388; G02F 2202/022; H01L 27/12; H01L 33/08; H01L 33/12; Y10T 428/10; Y10T 428/1059
USPC ................ 428/1.1, 1.5; 349/43, 93, 138, 149; 438/30, 38
See application file for complete search history.

(56) References Cited

U.S. PATENT DOCUMENTS

2008/0297677 A1* 12/2008 Kang et al. ...................... 349/43
2012/0127412 A1    5/2012 Lee et al.

FOREIGN PATENT DOCUMENTS

JP    2000-122039    4/2000
KR    10-2003-0065154    8/2003
(Continued)

OTHER PUBLICATIONS

K.-S. Jang et al., "Direct photo-patternable, low-temperature processable polyimide gate insulator for pentacene thin-film transistors.", Org. Electron. (2012), http://dx.doi.org/10.1016/j.orgel.2012.05.024.

(Continued)

*Primary Examiner* — Ruiyun Zhang
(74) *Attorney, Agent, or Firm* — H.C. Park & Associates, PLC

(57) ABSTRACT

Provided is a display panel including: an array substrate; an opposite substrate facing the array substrate and including a second base substrate and a common electrode disposed on the second base substrate; and a liquid crystal layer disposed between the array substrate and the opposite substrate. The array substrate includes: a first base substrate disposed in a display area and a non-display area; a photosensitive polymer organic layer disposed in a first non-display area and extending to a pad area, the photosensitive polymer organic layer having a taper shape at an end portion of the first non-display area; a thin film transistor disposed on the first base substrate in the display area; a pixel electrode connected to the thin film transistor; and a signal input pad connected to the thin film transistor and disposed on the photosensitive polymer organic layer in the pad area.

14 Claims, 12 Drawing Sheets

(51) Int. Cl.
*H01L 33/08* (2010.01)
*G02F 1/1345* (2006.01)

(56) References Cited

FOREIGN PATENT DOCUMENTS

| KR | 10-2009-0090493 | 8/2009 |
| KR | 10-2009-0100949 | 9/2009 |
| KR | 10-2009-0102215 | 9/2009 |
| KR | 10-2009-0102561 | 9/2009 |
| KR | 10-2009-0107301 | 10/2009 |
| KR | 10-2011-0020050 | 3/2011 |
| KR | 10-2011-0035649 | 4/2011 |
| KR | 10-2011-0068169 | 6/2011 |
| KR | 10-2012-0030732 | 3/2012 |

OTHER PUBLICATIONS

Ken-Ichi Fukukawa and Mitsuru Ueda, "Recent Progress of Photosensitive Polyimides", Polymer Journal, (2008), 281-296, vol. 40, No. 4.

* cited by examiner

DISPLAY PANEL AND METHOD OF MANUFACTURING THE SAME

CROSS-REFERENCE TO RELATED APPLICATION

This U.S. non-provisional patent application claims priority and the benefits from Korean Patent Application No. 10-2012-0115546, filed on Oct. 17, 2012, which is herein incorporated by reference for all purposes as if fully set forth herein.

BACKGROUND

1. Field of Disclosure

Exemplary embodiments of the present invention relate to a display panel and a method of manufacturing the same. More particularly, exemplary embodiments of the present invention relate to a display panel capable of reducing a pad area connected to an external circuit module and a method of manufacturing the display panel.

2. Discussion of Background

In general, a display device includes a display panel for displaying an image and an external circuit module for applying various control signals to the display panel. The display panel and the external circuit module are accommodated in a receiving container, e.g., a chassis. In addition, the display panel and the external circuit module are connected to each other through an electrical wiring member, such as a tape carrier package including a driver integrated circuit and a flexible printed circuit board.

The electrical wiring member is attached to a side portion of the display panel and connected to the external circuit module. Accordingly, the display panel includes an area to be connected to the external circuit module, and the receiving container secures a space in which the electrical wiring member is accommodated. In recent years, various researches have been performed to reduce the non-display area of the display panel, such as an area for the external circuit module and a space for the electrical wiring member.

The above information disclosed in this Background section is only for enhancement of understanding of the background of the invention and, therefore, it may contain information that does not form any part of the prior art nor what the prior art may suggest to a person of ordinary skill in the art.

SUMMARY

Exemplary embodiments of the present invention provide a display panel capable of reducing a pad area connected to an external circuit module.

Exemplary embodiments of the present invention provide a method of manufacturing the display panel.

Exemplary embodiments of the present invention provide a display panel including: an array substrate including a display area, a non-display area surrounding the display area, and a pad area extending from at least one side of the non-display area, the non-display area including a first non-display area adjacent to the pad area and a second non-display area other than the first non-display area; an opposite substrate facing the array substrate and including a second base substrate and a common electrode disposed on the second base substrate; and a liquid crystal layer disposed between the array substrate and the opposite substrate, wherein the array substrate further includes: a first base substrate disposed in the display area and the non-display area; a photosensitive polymer organic layer disposed in the first non-display area and extending to the pad area, the photosensitive polymer organic layer having a taper shape at an end portion of the first non-display area; a thin film transistor disposed on the first base substrate in the display area; a pixel electrode connected to the thin film transistor; and a signal input pad connected to the thin film transistor and disposed on the photosensitive polymer organic layer in the pad area.

Exemplary embodiments of the present invention provide a display panel including: an array substrate including a display area, a non-display area surrounding the display area, and a pad area extending from at least one side of the non-display area, the non-display area including a first non-display area adjacent to the pad area and a second non-display area other than the first non-display area; an opposite substrate facing the array substrate and including a second base substrate and a common electrode disposed on the second base substrate; and a liquid crystal layer disposed between the array substrate and the opposite substrate, wherein the array substrate further includes: a first base substrate disposed in the display area and the non-display area; a thin film transistor disposed on the first base substrate in the display area; a signal input pad connected to the thin film transistor and disposed in the pad area; a pixel electrode connected with the thin film transistor; and a photosensitive polymer organic layer disposed between the thin film transistor and the pixel electrode and covering at least part of the thin film transistor.

Exemplary embodiments of the present invention provide a method of manufacturing a display panel, including: forming a base substrate including a display area, a non-display area surrounding the display area, and a pad area extending from at least one side of the non-display area, the non-display area including a first non-display area adjacent to the pad area and a second non-display area other than the first non-display area; forming a photosensitive polymer organic layer in the pad area and the first non-display area; forming a thin film transistor on the base substrate in the display area and a signal input pad in the pad area to be connected to the thin film transistor; forming a pixel electrode connected to the thin film transistor to manufacture an array substrate; forming an opposite substrate including a common electrode facing the array substrate; disposing a liquid crystal layer between the array substrate and the opposite substrate; coupling the array substrate and the opposite substrate; and removing the base substrate from the pad area, wherein the photosensitive polymer organic layer has a taper shape at an end portion of the first non-display area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

Figure 1:
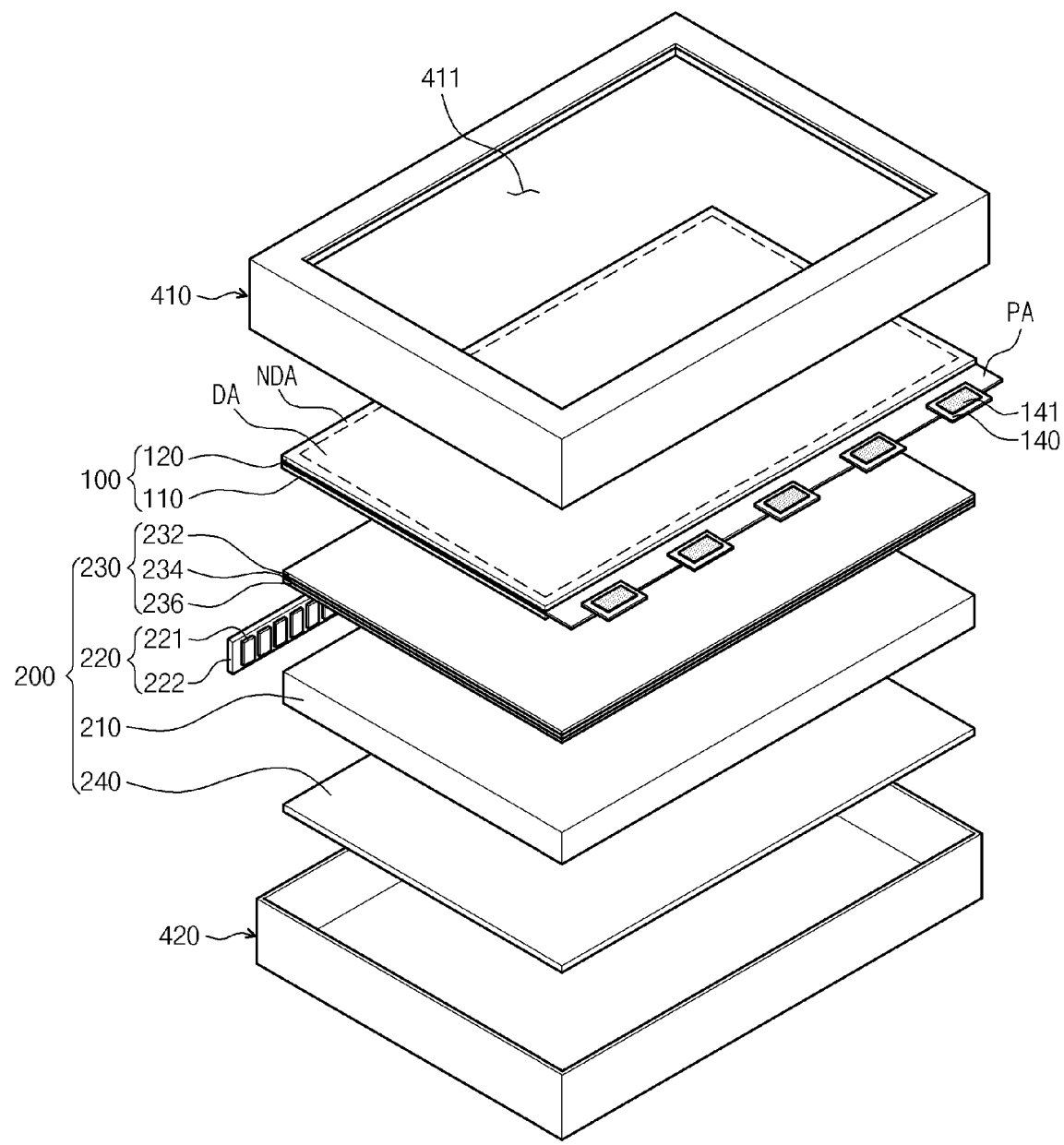
FIG. 1 is an exploded perspective view of a display device employing a display panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

FIG. 1 is an exploded perspective view of a display device employing a display panel according to an exemplary embodiment of the present invention.

Referring to FIG. 1, a display device includes a display panel 100, a backlight unit 200, an upper cover 410, and a lower cover 420.

Various display panels, such as a liquid crystal display panel, an electrophoretic display panel, an electrowetting display panel, etc., may be used as the display panel 100. In one exemplary embodiment, a liquid crystal display panel will be described as the display panel 100.

The display panel 100 has, for instance, a rectangular plate shape with long sides and short sides and includes a display area DA for displaying an image, a non-display area NDA adjacent to the display area DA, and a pad area PA extending from at least one side of the non-display area NDA. In addition, the display panel 100 includes an array substrate 110, an opposite substrate 120 facing the array substrate 110, and a liquid crystal layer (not shown) disposed between the array substrate 110 and the opposite substrate 120. Further, a polarizing film (not shown) may be attached on the outer surface of each of the array substrate 110 and the opposite substrate 120.

The array substrate 110 includes a plurality of pixels (not shown) arranged in the display area DA in a matrix form. Each pixel may include a plurality of sub-pixels having different colors. For instance, each sub-pixel has red, green, blue, yellow, or white color. Accordingly, light exiting from each sub-pixel has red, green, blue, yellow, or white color. In addition, each pixel includes a gate line (not shown), a data line (not shown) crossing the gate line, and a pixel electrode (not shown). Further, each pixel includes a thin film transistor (not shown) electrically connected to the gate line, the data line, and the pixel electrode. The thin film transistor switches a driving signal to apply to the pixel electrode.

The array substrate 110 may include a sealant pattern (not shown) disposed in the non-display area NDA to attach the array substrate 110 to the opposite substrate 120.

A flexible printed circuit board 140 on which a driver integrated circuit (IC) 141 is mounted may be disposed in the pad area PA of the array substrate 110, and the flexible printed circuit board 140 is connected to an external circuit module (not shown). The driver IC 141 receives various control signals from the external circuit module and applies the driving signal to the thin film transistor in response to the control signals.

The opposite substrate 120 may include a color filter disposed thereon to display a predetermined color using the light from the backlight unit 200 and a common electrode (not shown) disposed on the color filter to face the pixel electrode. The color filter has the red, green, blue, yellow or white color and is formed by a deposition or coating process. In one exemplary embodiment, the color filter is disposed on the opposite substrate 120, but it should not be limited thereto or thereby. That is, the color filter may be disposed on the array substrate 110 instead of the opposite substrate 120.

The liquid crystal layer includes liquid crystal molecules arranged in specific directions by voltages respectively applied to the pixel electrode and the common electrode and controls a transmittance of the light passing therethrough, thereby causing the display panel 100 to display images.

The backlight unit 200 is disposed on the back side of the display panel 100. The backlight unit 200 includes a light guide plate 210, a light source unit 220 including a plurality of light sources, an optical member 230, and a reflective sheet 240.

The light guide plate 210 is disposed under the display panel 100 and guides the light emitted from the light source unit 220 to the display panel 100. Particularly, the light guide plate 210 is overlapped with at least the display area DA of the display panel 100. The light guide plate 210 includes an exit surface from which the light exits, a lower surface facing the exit surface, and side surfaces connecting the exit surface and the lower surface. At least one of the side surfaces faces the light source unit 220 to serve as a light incident surface into which the light emitted from the light source unit 220 is incident, and a side surface facing the light incident surface serves as a light reflective surface to reflect the light.

In accordance with one exemplary embodiment of the present invention, the light source unit 220 may include a printed circuit board 222 and the light sources 221, e.g., light emitting diodes, mounted on the printed circuit board 222. Here, the light sources 221 may emit light having different colors from each other. For instance, a part of the light sources 221 emits red light, another part of the light sources 221 emits green light, and the other part of the light sources 221 emits blue light.

The light source unit 220 is disposed to emit the light while facing at least one of the side surfaces of the light guide plate 210 and provides the light to the display panel 100 through the light guide plate 210.

In accordance with one exemplary embodiment, the optical member 230 may be disposed between the light guide plate 210 and the display panel 100. The optical member 230 controls the light exiting through the light guide plate 210 from the light source unit 220. In addition, the optical member 230 includes a diffusion sheet 236, a prism sheet 234, and a protective sheet 232, which may be sequentially stacked in that order.

The diffusion sheet 236 diffuses the light exiting from the light guide plate 210. The prism sheet 234 condenses the light diffused by the diffusion sheet 236 to allow the light to travel in a direction substantially vertical to the display panel 100. The light exiting from the prism sheet 234 is vertically incident into the display panel 100. The protective sheet 232 is disposed on the prism sheet 234 to protect the prism sheet 234 from external impacts.

In one exemplary embodiment, the optical member 230 may include one diffusion sheet 236, one prism sheet 234, and one protective sheet 232, but it should not be limited thereto or thereby. That is, at least one of the diffusion sheet 236, the prism sheet 234, and the protective sheet 232 of the optical member 230 may be provided in a plurality, or one of the diffusion sheet 236, the prism sheet 234, and the protective sheet 232 may be omitted from the optical member 230.

The reflective sheet 240 is disposed under the light guide plate 210 and reflects the light leaked from the light guide plate without being directed to the display panel 100 to change the path of the light leaked from the light guide plate 210 to the display panel 100. The reflective sheet 240 includes a light reflective material to reflect the light. The reflective sheet 240 is disposed on the lower cover 420 and reflects the light emitted from the light source unit 220. As a result, the reflective sheet 240 can help increase the amount of the light provided to the display panel 100.

In one exemplary embodiment, the light source unit 220 may be disposed to provide the light to the side surface of the light guide plate 210, but it should not be limited thereto or thereby. That is, the light source unit 220 may be disposed to provide the light to the lower surface of the light guide plate 210. In addition, in the case that the light guide plate 210 is omitted from the backlight unit 200, the light source unit 220 may be disposed under the display panel 100, and thus the light emitted from the light source unit 220 may be directly provided to the display panel 100.

The upper cover 410 is disposed on the display panel 100. The upper cover 410 is provided with a display window 411 formed therethrough to expose the display area DA of the display panel 100. The upper cover 410 is coupled with the lower cover 420 to support a front edge portion of the display panel 100.

The lower cover 420 is disposed under the backlight unit 200. The lower cover 420 provides a space to accommodate the display panel 100 and the backlight unit 200 therein. In addition, the lower cover 420 is coupled with the upper cover 410 to accommodate the display panel 100 and the backlight unit 200 therein.

Figure 2:
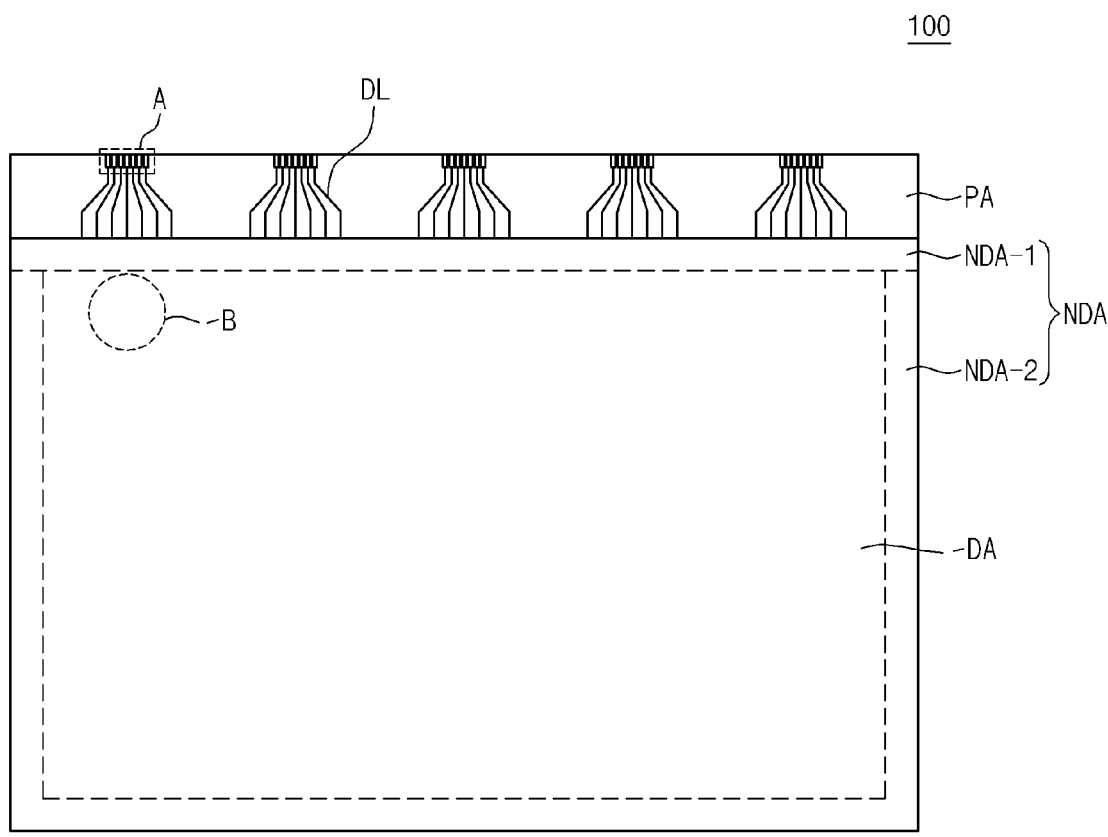
FIG. 2 is a plan view of the display panel shown in FIG. 1 before a flexible printed circuit board is attached to the display panel.
Figure 3:
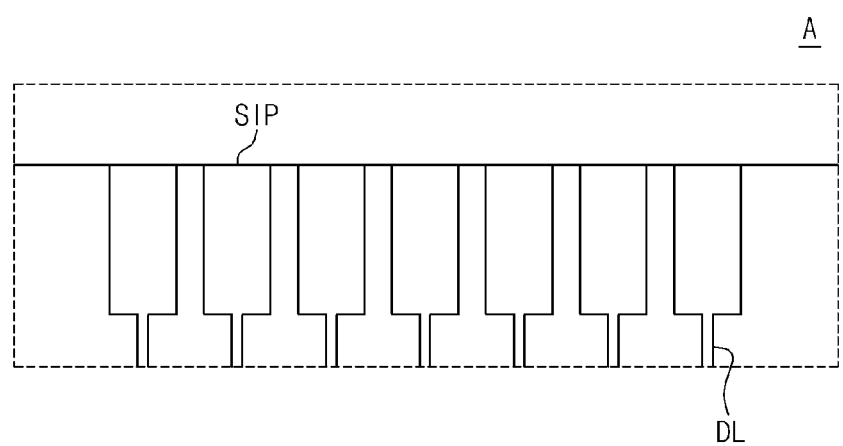
FIG. 3 is an enlarged view of portion A of FIG. 2.
Figure 4:
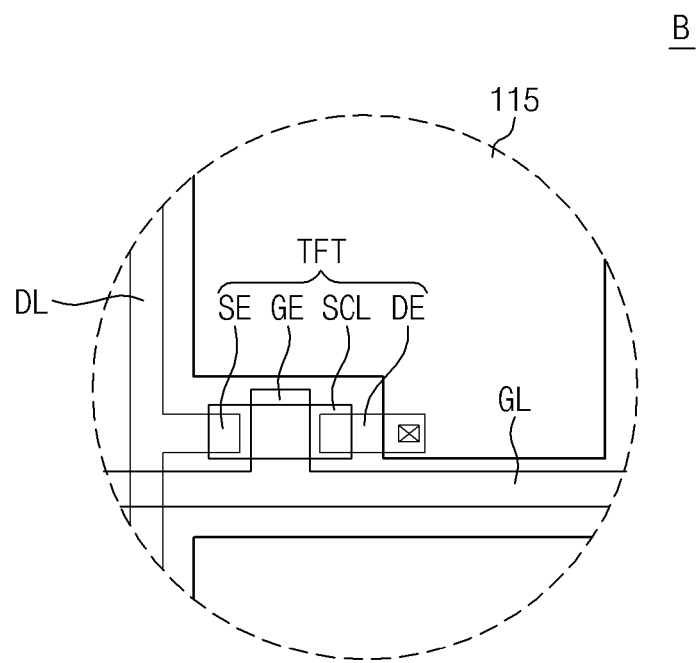
FIG. 4 is an enlarged view of portion B of FIG. 2.
Figure 5:
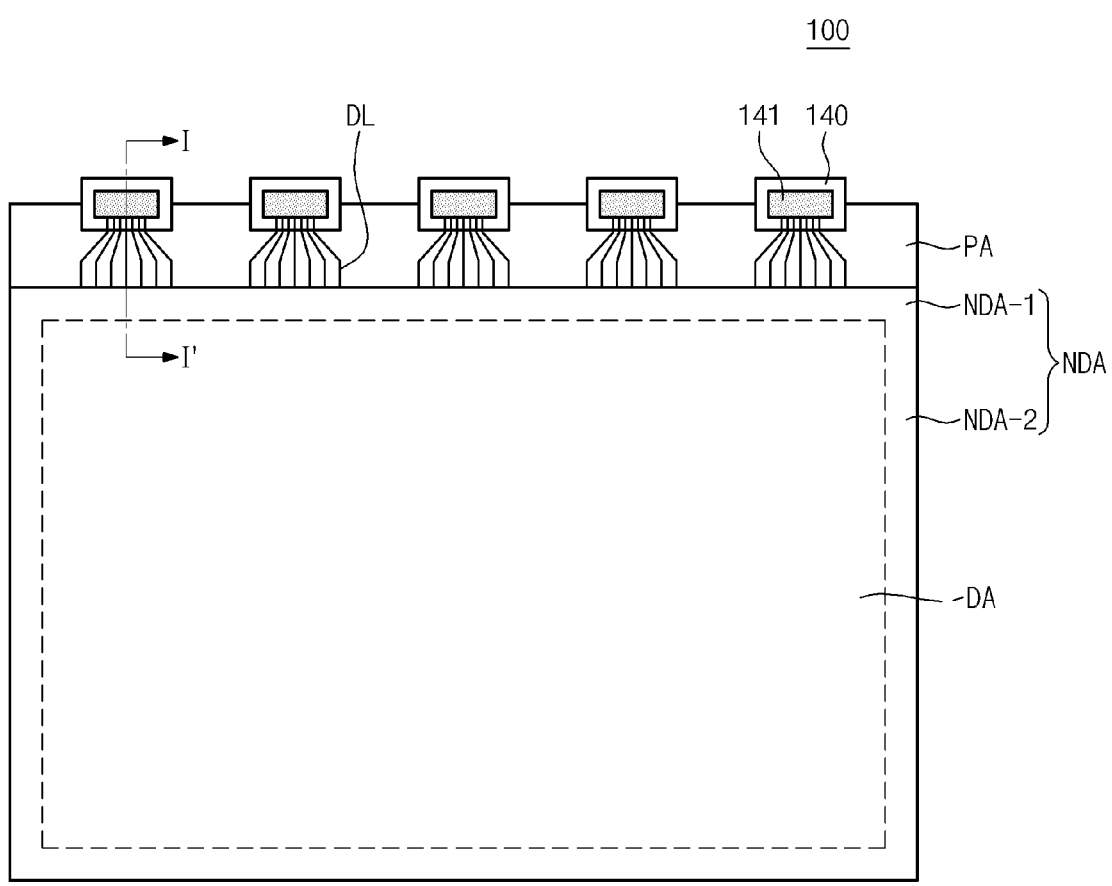
FIG. 5 is a plan view of the display panel to which the flexible printed circuit board is attached.
Figure 6:
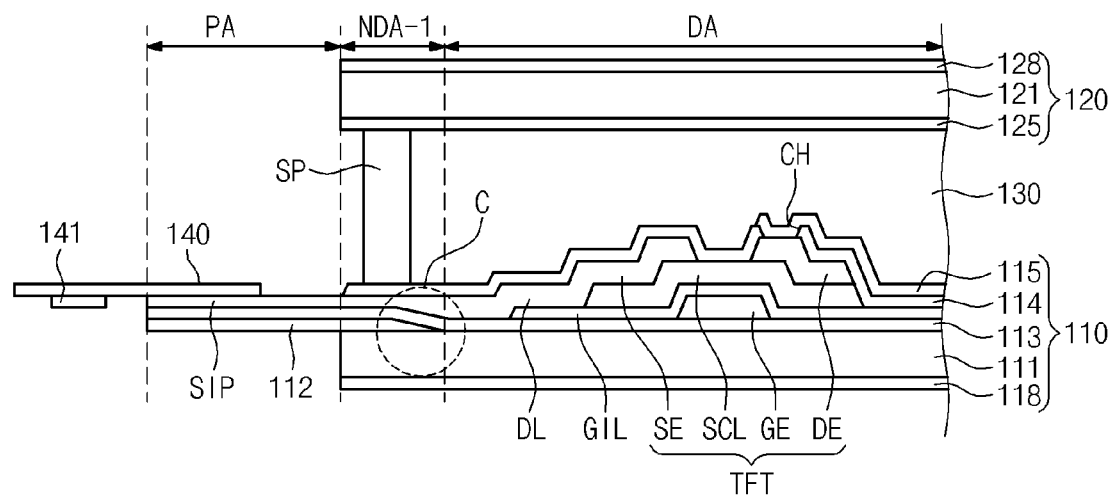
FIG. 6 is a cross-sectional view taken along a line I-I' of FIG. 5.
Figure 7:
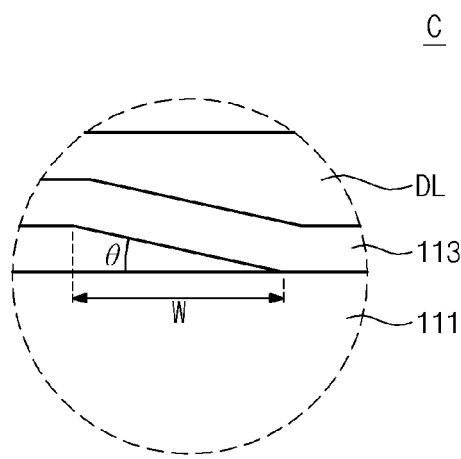
FIG. 7 is an enlarged view of portion C of FIG. 6.
Figure 8:
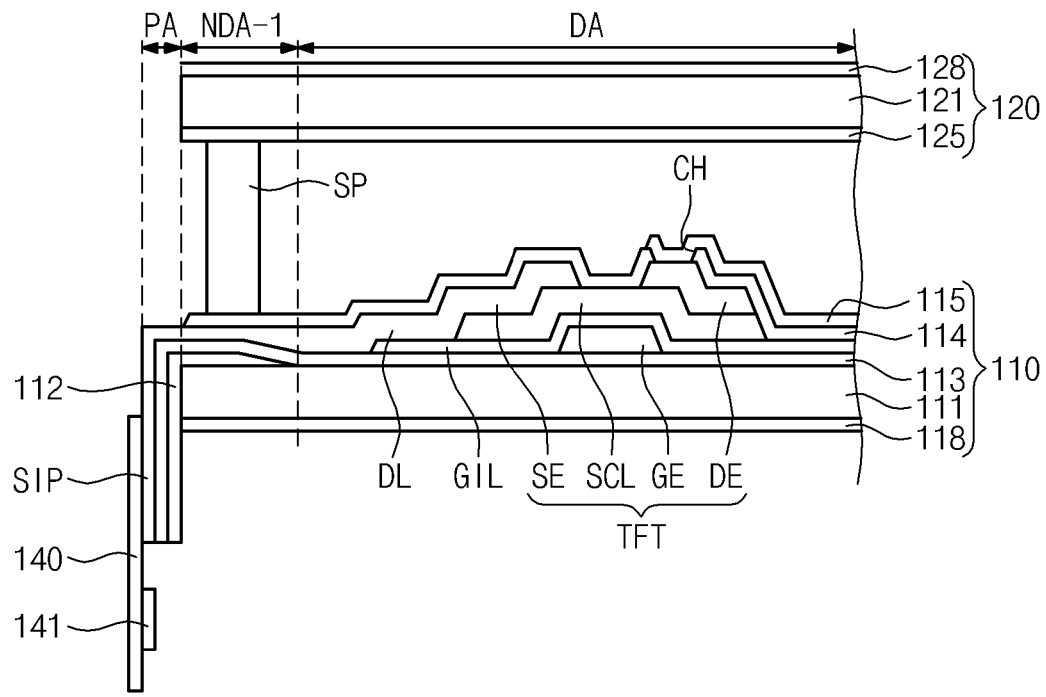
FIG. 8 is a cross-sectional view of a bent shape of a pad area of the display panel shown in FIG. 6.

FIG. 2 is a plan view of the display panel shown in FIG. 1 before a flexible printed circuit board is attached to the display panel, FIG. 3 is an enlarged view of portion A of FIG. 2, FIG. 4 is an enlarged view of portion B of FIG. 2, FIG. 5 is a plan view of the display panel to which the flexible printed circuit board is attached, FIG. 6 is a cross-sectional view taken along a line I-I' of FIG. 5, FIG. 7 is an enlarged view of portion C of FIG. 6, and FIG. 8 is a cross-sectional view of the bent shape of a pad area of the display panel shown in FIG. 6.

Referring to FIGS. 2 to 8, the display panel 100 may include the display area DA displaying the image, the non-display area NDA surrounding the display area DA, and the pad area PA extending from at least one side of the non-display area NDA in accordance with one exemplary embodiment. Further, the non-display area NDA may include a first non-display area NDA-1 adjacent to the pad area PA and a second non-display area NDA-2 except for the first non-display area NDA-1.

In addition, the display panel 100 may include the array substrate 110, the opposite substrate 120 facing the array substrate 110, and the liquid crystal layer 130 disposed between the array substrate 110 and the opposite substrate 120. Further, the polarizing films 118 and 128 may be respectively attached to the outer surface of each of the array substrate 110 and the opposite substrate 120.

According to one exemplary embodiment, the array substrate 110 has a shape corresponding to that of the display panel 100, and thus the array substrate 110 includes the display area DA, the non-display area NDA, and the pad area PA.

The pixels are arranged in the display area DA of the array substrate 110, which is in the matrix form, and each pixel includes the thin film transistor TFT and the pixel electrode 115.

According to one exemplary embodiment, the sealant pattern SP may be disposed in the non-display area NDA of the array substrate 110. The sealant pattern SP may be disposed to surround the display area DA to couple the array substrate 110 to the opposite substrate 120 and prevents the liquid crystal molecules of the liquid crystal layer 140 from leaking.

A signal input pad SIP may be disposed in the pad area PA of the array substrate 110 to be connected to the thin film transistor TFT.

In addition, in accordance with one exemplary embodiment, the array substrate 110 may include a first base substrate 111, a photosensitive polymer organic layer 112 disposed on the first base substrate 111 in the first non-display area NDA-1 and extending in the pad area PA, an insulating layer 113 disposed on the photosensitive polymer organic layer 112 and the first base substrate 111, the thin film transistor TFT disposed on the insulating layer 113, and the pixel electrode 115 connected to the thin film transistor TFT.

According to one exemplary embodiment, the first base substrate 111 is formed to correspond to the display area DA and the non-display area NDA and may have a rectangular plate shape with long sides and short sides. That is, the first base substrate 111 may not be overlapped with the pad area PA.

The first base substrate 111 includes a transparent insulating material to transmit the light therethrough. In addition, the first base substrate 111 may be a rigid type substrate, such as a glass substrate, a quartz substrate, a glass ceramic substrate, a crystalline glass substrate, etc., or a flexible type substrate, such as a film substrate containing the organic polymer layer, a plastic substrate, etc. The materials used to form the first base substrate 111 have high heat-resistance to endure high process temperatures during the manufacturing process.

In accordance with one exemplary embodiment, the photosensitive polymer organic layer 112 may be disposed on a surface of the first base substrate 111 in the first non-display area NDA-1, which faces the opposite substrate 120, and may extend to the pad area PA. That is, in this exemplary embodiment, the first base substrate 111 does not exist under the photosensitive polymer organic layer 112 in the pad area PA.

In addition, the photosensitive polymer organic layer 112 may include photosensitive polyimide (PSPI). For instance, in the case that the photosensitive polyimide includes positive-type photosensitive polyimide, the photosensitive polyimide may be represented by one of the following formulas 1 to 5.

Formula 1

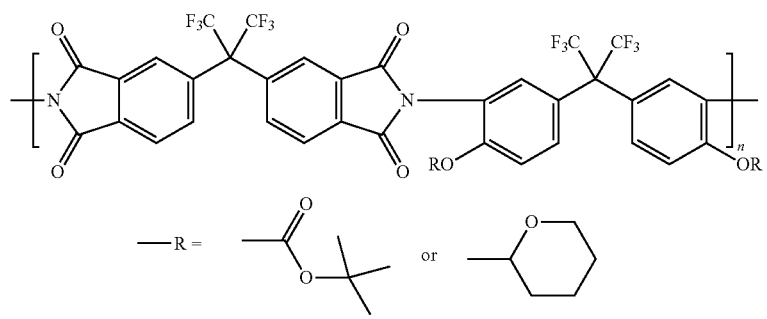

Formula 2

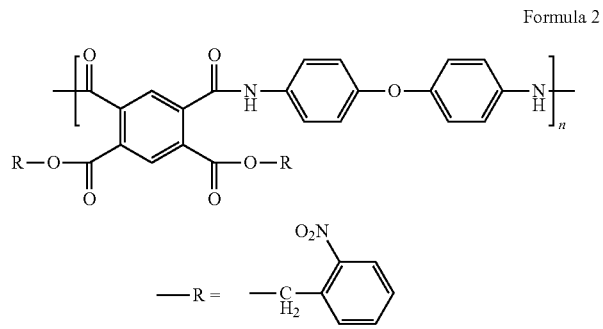

Formula 3

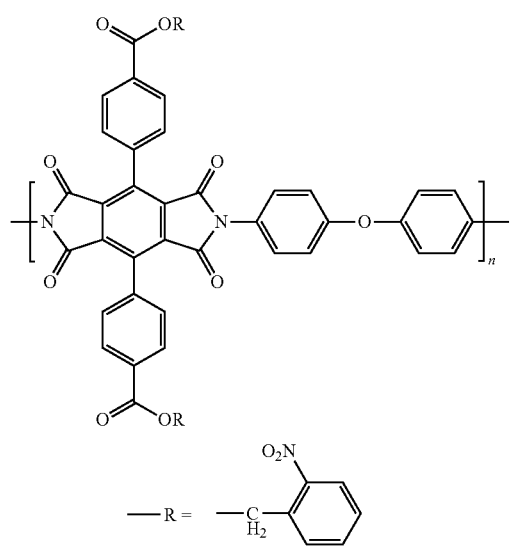

Formula 4
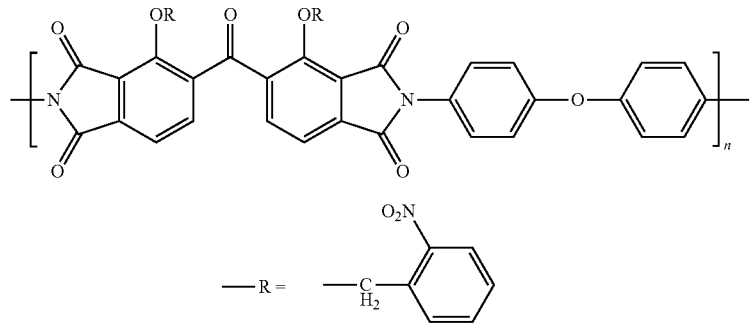
Formula 5
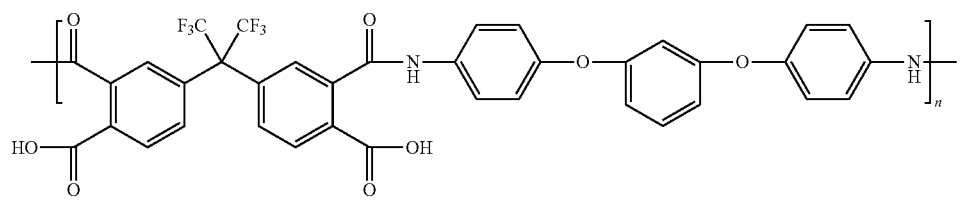
In addition, in the case that the photosensitive polyimide includes negative-type photosensitive polyimide, the photosensitive polyimide may be represented by one of the following formulas 6 to 11.
Formula 6
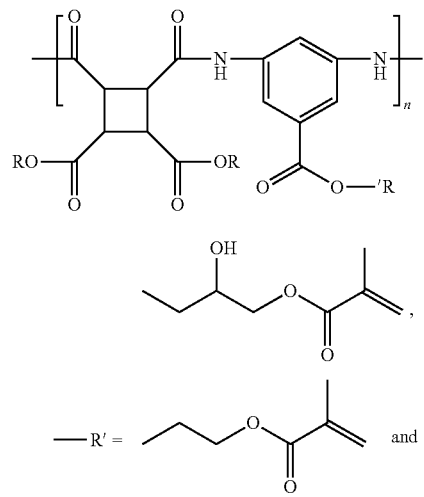
Formula 7
Formula 8
Formula 9
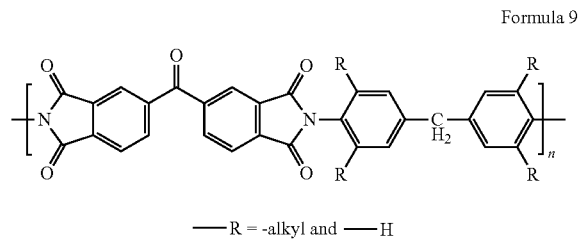

-continued

Formula 10

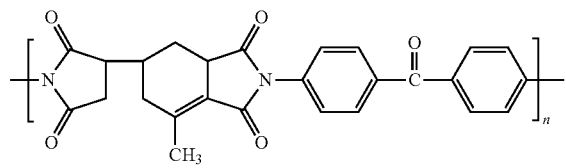

Formula 11

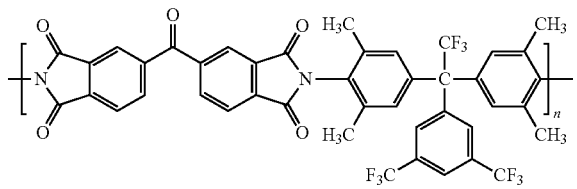

The examples shown above are illustrative only and not restrictive in any sense. Different or additional materials may be provided to the photosensitive polymer organic layer 112 if they have suitable physical/chemical properties. According to one exemplary embodiment, the photosensitive polymer organic layer 112 may have a glass transition temperature equal to or greater than about 320 degrees Celsius. This is to prevent the photosensitive polymer organic layer from being deformed when the thin film transistor TFT is manufactured. For instance, part of the processes used to manufacture the thin film transistor TFT is typically performed at a temperature of about 300 degrees Celsius. Accordingly, the glass transition temperature of the photosensitive polymer organic layer 112 is required to be set higher than the process temperatures of the thin film transistor TFT, so that the deformation of the photosensitive polymer organic layer 112 can be prevented.

In addition, the photosensitive polymer organic layer 112 may have a thermal expansion coefficient, for instance, from about 3 ppm/° C. to about 10 ppm/° C. A thermal coefficient in this range can reduce stress between the first base substrate 111 and the photosensitive polymer organic layer 112 due to a thermal expansion difference or a thermal contraction difference therebetween.

Further, the photosensitive polymer organic layer 112 has an advantage when a curvature radius of photosensitive polymer organic layer 112 is small. The photosensitive polymer organic layer 112 may have the curvature radius, for instance, in a range of about 1 micrometer to about 100 micrometers when it is bent. This is because the area that the photosensitive polymer organic layer 112 occupies tends to be greater when the curvature radius of the photosensitive polymer organic layer 112 exceeds about 100 micrometers. When the area that the photosensitive polymer organic layer 112 occupies becomes greater, the upper and lower covers accommodating the display panel 100 may be required to secure additional space in the pad area PA.

According to one exemplary embodiment, the photosensitive polymer organic layer 112 may have a thickness from about 3 micrometers to about 5 micrometers to support the signal input pad SIP. When the thickness of the photosensitive polymer organic layer 112 is less than about 3 micrometers, the photosensitive polymer organic layer 112 may not sufficiently support the signal input pad SIP, and thus the photosensitive polymer organic layer 112 may be damaged while being bent. In addition, when the thickness of the photosensitive polymer organic layer 112 exceeds about 5 micrometers, it may be difficult to appropriately maintain the distance between the array substrate 110 and the opposite substrate 120.

The photosensitive polymer organic layer 112 may have a taper shape at the end portion thereof adjacent to the display area DA. The taper shape of the photosensitive polymer organic layer 112 may prevent opening of a metal layer or non-uniformity of a thickness of the metal layer disposed on the photosensitive polymer organic layer 112. By way of example, the taper angle θ of the end portion may be in a range from about 20 degrees to about 70 degrees, and the width W of the end portion may be in a range from about 3 micrometers to about 15 micrometers.

In accordance with one exemplary embodiment, the insulating layer 113 is disposed on the photosensitive polymer organic layer 112 and the first base substrate 111. The insulating layer 113 may include an insulating material, e.g., silicon nitride, silicon oxide, etc. that can transmit light. The insulating layer 113 can prevent the materials included in the photosensitive polymer organic layer 112 from diffusing to the thin film transistor TFT, thereby preventing the driving characteristics of the thin film transistor TFT from being degraded.

In addition, the thin film transistor TFT including a semiconductor layer SCL, a gate electrode GE, a source electrode SE, and a drain electrode DE may be disposed on the insulating layer 113. More specifically, the thin film transistor TFT includes the gate electrode GE disposed on the insulating layer 113, a gate insulating layer GIL covering the gate electrode GE, the semiconductor layer SCL disposed on the gate insulating layer GIL, and the source and drain electrodes SE and DE respectively connected to both end portions of the semiconductor layer SCL. The semiconductor layer SCL includes a channel area overlapped with the gate electrode GE when viewed in a plan view, a source area making contact with the source electrode SE, and a drain area making contact with the drain electrode DE. The gate electrode GE of the thin film transistor TFT is connected to a gate line GL that applies a scan signal or a gate signal to the thin film transistor TFT. The source electrode SE of the thin film transistor TFT is connected to a data line DL that applies a data voltage to the thin film transistor TFT.

In the present exemplary embodiment, a bottom gate thin film transistor in which the gate electrode GE is disposed under the semiconductor layer SCL has been described, but the thin film transistor should not be limited to the bottom gate thin film transistor. That is, a top gate thin film transistor in which a gate electrode GE is disposed on a semiconductor layer SCL may be used as a thin film transistor TFT.

Further, a protective layer 114 may be disposed on the thin film transistor TFT. The protective layer 114 is provided with a contact hole CH formed therethrough to expose a portion of the drain electrode DE. In addition, the protective layer 114 may have a multi-layer structure. For instance, the protective layer 114 may include an inorganic protective layer to cover the thin film transistor TFT and the gate insulating layer GIL, and an organic protective layer disposed on the inorganic protective layer. The organic protective layer may be provided to remove the differences in the level resulting from the formation of the thin film transistor TFT and planarize the upper surface thereof.

Further, the pixel electrode 115 may be disposed on the protective layer 114 and electrically connected to the drain electrode DE through the contact hole CH. The pixel electrode 115 may include a transparent conductive oxide, such as indium tin oxide (ITO) or indium zinc oxide (IZO).

At least one of the gate line GL and the data line DL—the data line DL according to one exemplary embodiment—may extend to the pad area PA and connected to the signal input pad SIP to which external signals are applied to control the display panel 100. That is, the signal input pad SIP may be disposed on the insulating layer 113 in the pad area PA.

In accordance with one exemplary embodiment, the signal input pad SIP is connected to the flexible printed circuit board 140 on which the driver IC 141 is mounted. The driver IC 141 receives various control signals from external circuit modules and applies the driving signal to the thin film transistor TFT through the signal input pad SIP, which is used to drive the display panel 100, in response to the control signals.

The opposite substrate 120 may be disposed in the display area DA and the non-display area NDA. The opposite substrate 120 includes a second base substrate 121 and the common electrode 125 disposed on the second base substrate 121. The second base substrate 121 may be either a rigid type substrate or a flexible type substrate similar to the first base substrate 111. The common electrode 125 may include a transparent conductive oxide as the pixel electrode 115. Further, the common electrode 125 applies a common voltage from an external source (not shown) to each pixel.

The liquid crystal layer 130 includes liquid crystal molecules. The liquid crystal molecules are arranged in specific directions by the electric fields generated between the pixel electrode 115 and the common electrode 125 to control the transmittance of the light passing through the liquid crystal layer 130. Accordingly, the liquid crystal layer 130 transmits the light provided from the backlight unit 200 in response to the electric fields, and thus the display panel 110 displays the images.

As described above, the first base substrate 111 and the second base substrate 121 may not exist in the pad area PA of the display panel 100, and only the photosensitive polymer organic layer 112, the insulating layer 113, the signal input pad SIP, and the flexible printed circuit board 140 may be disposed in the pad area PA. That is, the signal input pad SIP is disposed on the photosensitive polymer organic layer 112 in the pad area PA, and thus the signal input pad SIP and the photosensitive polymer organic layer 112 have a shape similar to a film layer. Thus, the pad area PA may be bent toward the backlight unit 200, so that the width of the pad area PA of the display panel 100 may be reduced.

Also, the upper and lower covers, which are provided to accommodate the display panel 100, can advantageously take a reduced volume, particularly around the pad area PA.

Hereinafter, a method of manufacturing the display panel 100 will be described in detail with reference to FIGS. 9 to 13.

FIGS. 9 to 13 are cross-sectional views showing a method of manufacturing the display panel shown in FIGS. 1 to 8.

In accordance with one exemplary embodiment, the array substrate 110 is prepared. The array substrate 110 includes the display area DA, the non-display area NDA surrounding the display area DA, and the pad area PA extending from at least one side of the non-display area NDA. The non-display area NDA includes the first non-display area NDA-1 adjacent to the pad area PA and a second non-display area NDA-2 except for the first non-display area NDA-1.

In addition, the array substrate 110 includes the first base substrate 111, the photosensitive polymer organic layer 112 disposed on the first base substrate 111, the insulating layer 113 disposed on the photosensitive polymer organic layer 112, the thin film transistor TFT disposed on the insulating layer 113, and the pixel electrode 115 connected to the thin film transistor TFT.

Figure 9:
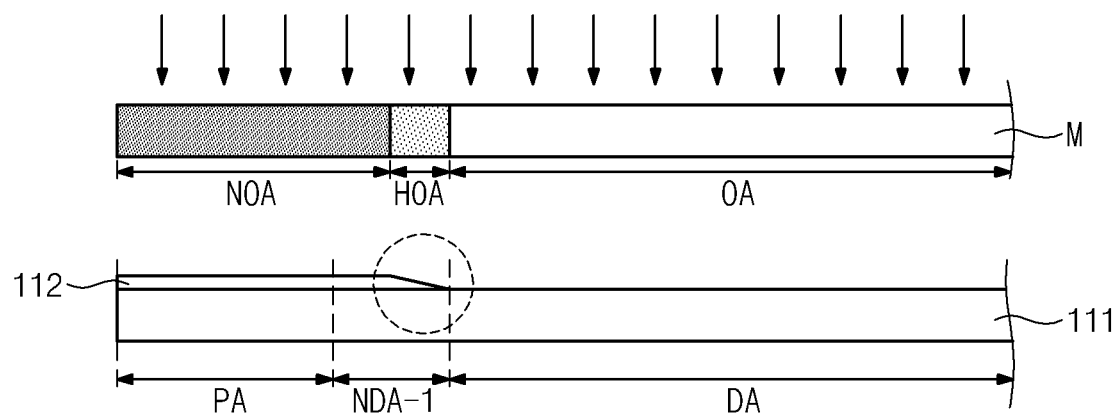
FIGS. 9 to 13 are cross-sectional views showing a method of manufacturing the display panel shown in FIGS. 1 to 8.

Referring to FIG. 9, the first base substrate 111 is prepared. The first base substrate 111 is disposed in the display area DA, the non-display area NDA, and the pad area PA and has, for instance, a rectangular plate shape with long sides and short sides. The first base substrate 111 includes a transparent insulating material to transmit the light therethrough. In addition, the materials used to form the first base substrate 111 have high heat resistance enough to endure high process temperatures when the first base substrate 111 is formed.

Then, the photosensitive polymer organic layer 112 is formed on the first base substrate 111 to cover the first non-display area NDA-1 and the pad area PA. The photosensitive polymer organic layer 112 may include photosensitive polyimide and has a thickness from about 3 micrometers to about 5 micrometers. The photosensitive polymer organic layer 112 is formed by coating a photosensitive polymer organic material on the first base substrate 111 and patterning the photosensitive polymer organic material using a photolithography process.

According to one exemplary embodiment, the patterning process of the photosensitive polymer organic material may be performed as follows. The photosensitive polymer organic material is coated on the first base substrate 111.

Then, light is irradiated onto the photosensitive polymer organic material using a mask M, such as a slit mask, a halftone mask, etc. For instance, when the photosensitive polymer organic material includes positive-type photosensitive polyimide, the mask M includes an open area OA through which the light transmits, a non-open area NOA through which the light does not transmit, and a half-open area HOA through which the light partially transmits. The open area OA corresponds to the display area DA, and the non-open area NOA corresponds to the pad area PA and a portion of the first non-display area NDA-1 adjacent to the pad area PA. In addition, the half-open area HOA is disposed between the open area OA and the non-open area NOA and corresponds to the area adjacent to the first non-display area NDA-1 adjacent to the display area DA. Here, the half-open area HOA has a transmittance of light that is increased as it is closer to the open area OA and decreased as it is closer to the non-open area NOA.

When the light is irradiated onto the photosensitive polymer organic material using the mask M, the photosensitive polymer organic material corresponding to the open area OA is removed, the photosensitive polymer organic material corresponding to the non-open area NOA remains, and the photosensitive polymer organic material corresponding to the half-open area HOA is partially removed and partially remains. In this case, the amount of the photosensitive polymer organic material remaining in the half-open area HOA becomes smaller as it is closer to the open area OA and becomes larger as it is closer to the non-open area NOA. Accordingly, the photosensitive polymer organic layer 112 is disposed in the first non-display area NDA-1 and the pad area PA and includes the end portion having a taper shape, which is adjacent to the display area DA. The taper shape of the photosensitive polymer organic layer 112 may prevent opening of a metal layer or non-uniformity of a thickness of the metal layer disposed on the photosensitive polymer organic layer 112.

In one exemplary embodiment, the taper angle θ of the end portion is in the range from about 20 degrees to about 70 degrees, and the width W of the end portion is in the range from about 3 micrometers to about 15 micrometers.

While a positive-type photosensitive polyimide has been described as the photosensitive polymer organic material, the photosensitive polymer organic material should not be limited to the positive-type photosensitive polyimide. That is, the photosensitive polymer organic material may be a negative-type photosensitive polyimide. In this case, the open area OA of the mask M corresponds to the pad area PA and the portion of the first non-display area NDA-1 adjacent to the pad area PA. In addition, the non-open area NOA corresponds to the display area DA. The half-open area HOA has a light transmittance increased as it is closer to the non-open area NOA and decreased as it is closer to the open area OA.

The remaining photosensitive polymer organic material is cured after the light is irradiated onto the photosensitive polymer organic material, and thus the photosensitive polymer organic layer 112 is formed.

Figure 10:
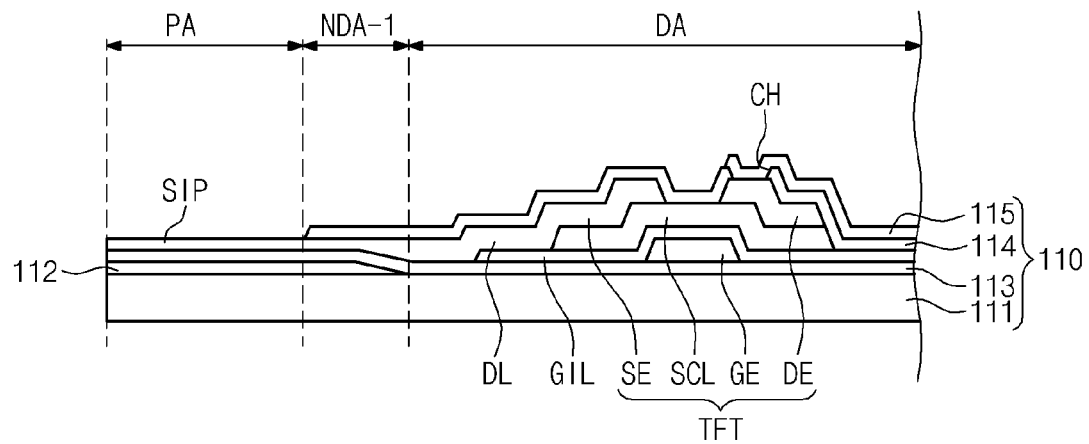

Then, the insulating layer 113 is formed to cover the first base substrate 111 and the photosensitive polymer organic material 112 as shown in FIG. 10. The insulating layer 113 may include an insulating material that transmits the light therethrough, e.g., silicon nitride, silicon oxide, etc. In addition, the insulating layer 113 is formed by a physical vapor deposition (PVD) method or a chemical vapor deposition (CVD) method.

The insulating layer 113 has generally a good adhesive property with a metallic material. Accordingly, the insulating layer 113 can prevent detachment of the metal layers of the thin film transistor TFT, which occurs when the metal layers of the thin film transistor TFT are directly deposited on the photosensitive polymer organic layer 112.

In addition, the insulating layer 113 prevents the material included in the photosensitive polymer organic layer 112 from diffusing to the thin film transistor TFT. Accordingly, the insulating layer 113 can prevent the driving characteristics of the thin film transistor TFT from being degraded.

After the insulating layer 113 is formed, the thin film transistor TFT is formed on the insulating layer 113. The thin film transistor TFT includes the gate electrode GE, the semiconductor layer SCL, the source electrode SE, and the drain electrode DE.

To form the thin film transistor TFT, the gate electrode GE is formed on the insulating layer 113 and the gate insulating layer GIL is formed to cover the gate electrode GE. Then, the semiconductor layer SCL is formed on the gate insulating layer GIL and the source and drain electrodes SE and DE are formed to respectively make contact with the source and drain areas of the semiconductor layer SCL. The channel area is disposed between the source area and the drain area.

In addition, when the source electrode SE and the drain electrode DE are formed, the data line DL, which is electrically connected to the source electrode SE, and the signal input pad SIP, which is electrically connected to the data line DL and disposed on the insulating layer 113 of the pad area PA, may be formed.

Then, the protective layer 114 is formed to cover the thin film transistor TFT. The protective layer 113 may include an inorganic material, an organic material, or the compound of an inorganic material and an organic material.

The protective layer 114 is partially removed to expose a portion of the drain electrode DE. The removed portion of the protective layer 114 serves as the contact hole CH.

After that, the pixel electrode 115 is formed to be connected to the drain electrode DE of the thin film transistor TFT through the contact hole CH.

Figure 11:
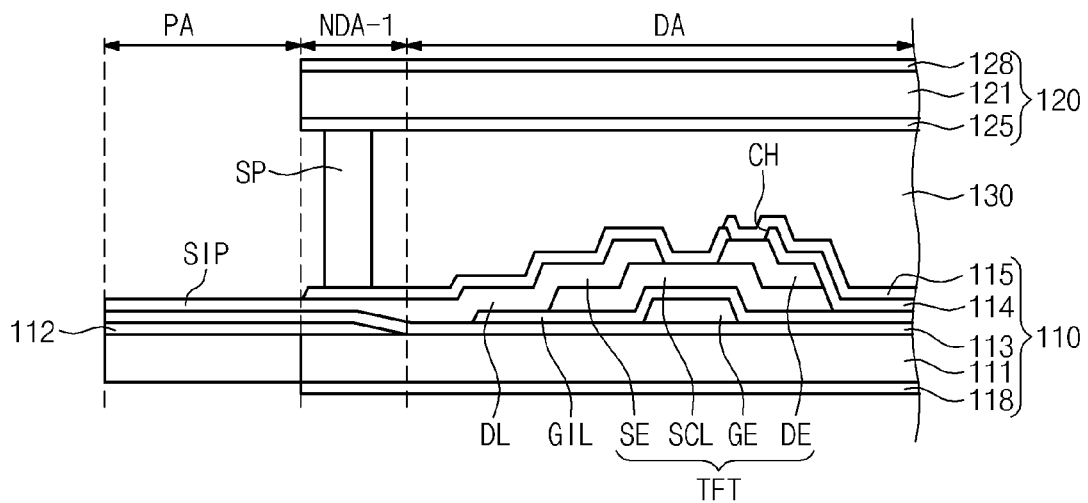

Referring to FIG. 11, the sealant pattern SP is formed in the non-display area NDA of the array substrate 110 to surround the display area DA.

In accordance with one exemplary embodiment, the sealant pattern SP may be disposed between the array substrate 110 and the opposite substrate 120 corresponding to the non-display area NDA. The sealant pattern SP may be disposed to surround the display area DA to couple the array substrate 110 to the opposite substrate 120 and prevent the liquid crystal molecules of the liquid crystal layer 130 from leaking. In addition, the sealant pattern SP is cured by heat or light.

Then, the liquid crystal layer 130 including the liquid crystal molecules is disposed in the display area DA.

After the liquid crystal layer 130 is disposed, the opposite substrate 120 that includes the second base substrate 121 and the common electrode 125 disposed on the second base substrate 121 is prepared. Here, the opposite substrate 120 includes the display area DA and the non-display area NDA.

After that, the opposite substrate 120 is disposed such that the common electrode 125 faces the array substrate 110. The opposite substrate 120 is coupled to the array substrate 110 by the sealant pattern SP.

In the present exemplary embodiment, the liquid crystal layer 130 is disposed after the sealant pattern SP is formed, and then the array substrate 110 is coupled to the opposite substrate 120, but they should not be limited thereto or thereby. Any suitable method or sequence to put together the array substrate 110, the opposite substrate 120, the liquid crystal layer, and the sealant pattern SP may be used. As an alternative example, the liquid crystal layer 130 may be formed by injecting the liquid crystal molecules between the array substrate 110 and the opposite substrate 120 after the array substrate 110 is coupled to the opposite substrate 120 using the sealant pattern SP.

When the array substrate 110 is coupled to the opposite substrate 120, heat or light is applied to the sealant pattern SP to cure the sealant pattern SP.

Figure 12:
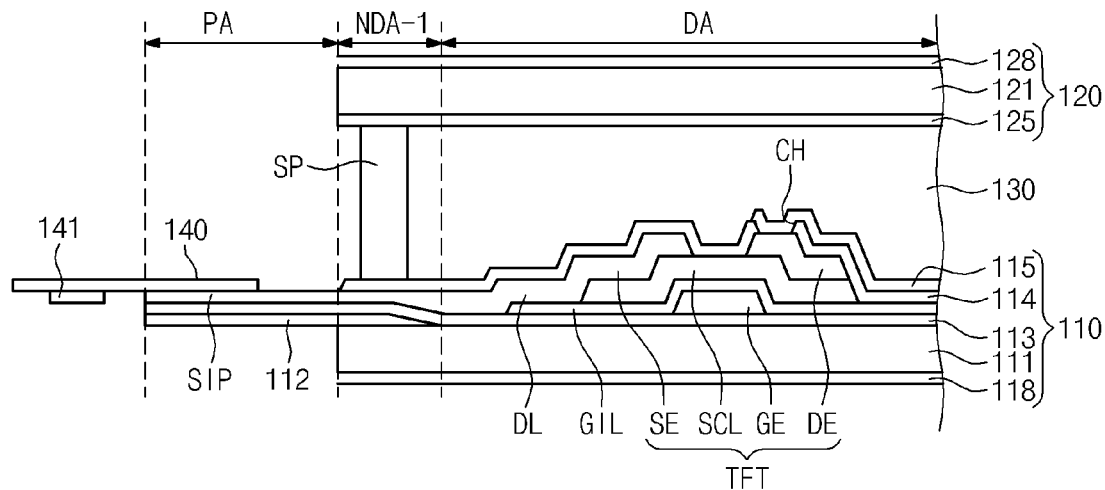

Referring to FIG. 12, the first base substrate 111 is removed from the pad area PA, for example, using a laser cutting method or a wet etch method. Thus, only the photosensitive polymer organic layer 112, the insulating layer 113, and the signal input pad SIP may remain in the pad area PA among others.

When the first base substrate 111 is removed from the pad area PA, the flexible printed circuit board 140 is attached to the signal input pad SIP so as to electrically connect the signal input pad SIP and the driver IC 141, thereby manufacturing the display panel 100.

Figure 13:
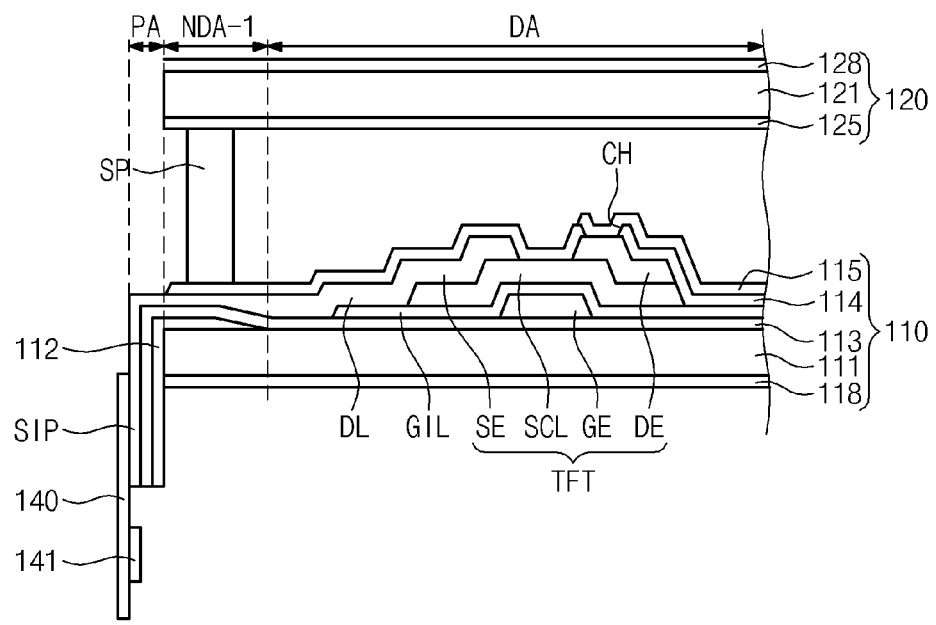

Referring to FIG. 13, after the flexible printed circuit board 140 is connected to the signal input pad SIP, the pad area PA is bent toward the backlight unit.

Then, the display panel 100 and the backlight unit are accommodated in the upper and lower covers, to thereby manufacture the display device.

In the display panel 100 manufactured according to one exemplary embodiment, the pad area PA may be bent toward the backlight unit, for instance. Accordingly, the space for the pad area PA in the display device can be reduced.

Hereinafter, a display panel according to another exemplary embodiment will be described with reference to FIGS. 14 to 21. In FIGS. 14 to 21, the same reference numerals denote the same elements in FIGS. 1 to 13, and thus detailed descriptions of the same elements will not repeated.

Figure 14:
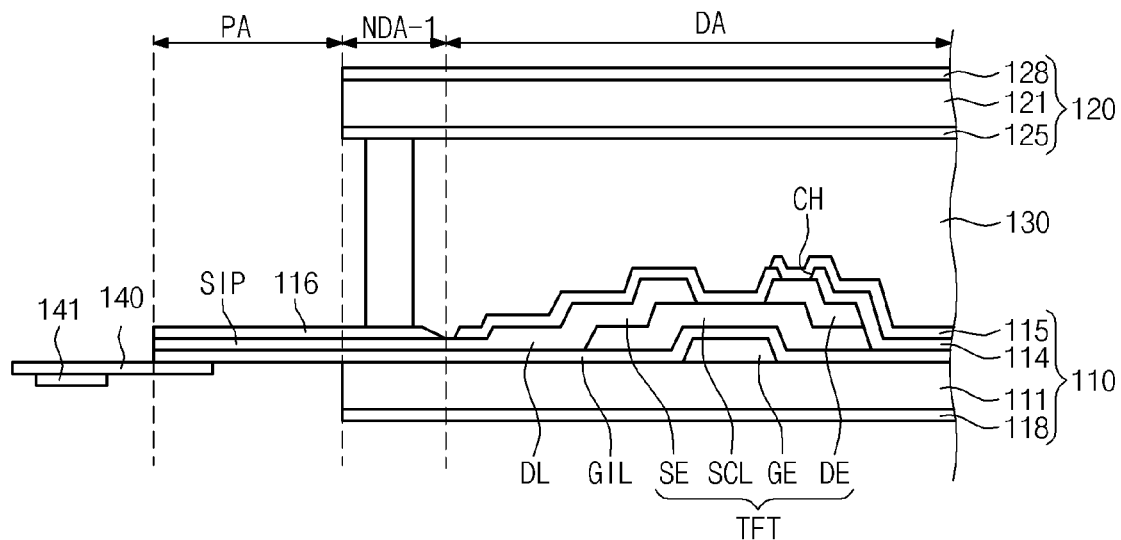
FIG. 14 is a cross-sectional view of a display panel according to another exemplary embodiment of the present invention.
Figure 15:
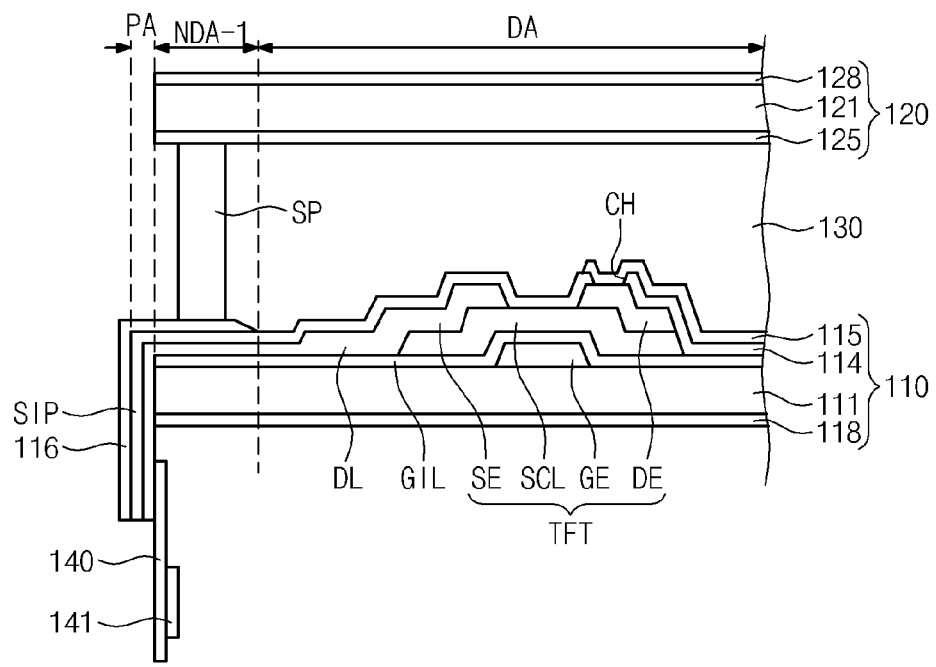
FIG. 15 is a cross-sectional view of a bent shape of a pad area of the display panel shown in FIG. 14.

FIG. 14 is a cross-sectional view of a display panel according to another exemplary embodiment of the present disclosure, and FIG. 15 is a cross-sectional view of the bent shape of a pad area of the display panel shown in FIG. 14.

Referring to FIGS. 14 and 15, the display panel includes the display area DA displaying the image, the non-display area NDA surrounding the display area DA, and the pad area PA extending from at least one side of the non-display area NDA. The non-display area NDA includes a first non-display area NDA-1 adjacent to the pad area PA and a second non-display area NDA-2 except for the first non-display area NDA-1.

In addition, the display panel 100 includes the array substrate 110, the opposite substrate 120 facing the array substrate 110, and the liquid crystal layer 130 disposed between the array substrate 110 and the opposite substrate 120.

In accordance with one exemplary embodiment, the array substrate 110 may have a shape corresponding to that of the display panel 100, and thus the array substrate 110 includes the display area DA, the non-display area NDA, and the pad area PA. The array substrate 110 may include a first base substrate 111, a thin film transistor TFT disposed on the first base substrate 111, a protective layer 114 covering the thin film transistor TFT, a photosensitive polymer organic layer 116 disposed on the protective layer 114 in the first non-display area NDA-1 and the pad area PA, and the pixel electrode 115 connected to the thin film transistor TFT.

The photosensitive polymer organic layer 116 has a curvature radius of about 1 micrometer to about 100 micrometers while being bent. In addition, the photosensitive polymer organic layer 116 has a thickness from about 3 micrometers to about 5 micrometers to support the signal input pad SIP. The photosensitive polymer organic layer 116 has a taper shape at the end portion thereof adjacent to the display area DA. The taper angle θ of the end portion is in a range from about 20 degrees to about 70 degrees, and the width W of the end portion is in a range from about 3 micrometers to about 15 micrometers. Further, the first base substrate 111 may not exist under the photosensitive polymer organic layer 116 in the pad area PA.

The thin film transistor TFT includes a semiconductor layer SCL, a gate electrode GE, a source electrode SE, and a drain electrode DE. The source electrode SE is connected to a data line DL that applies a data voltage to the thin film transistor TFT.

The protective layer 114 is provided with a contact hole CH formed therethrough to expose a portion of the drain electrode DE.

The pixel electrode 115 is electrically connected to the drain electrode DE through the contact hole CH.

A sealant pattern SP is disposed between the array substrate 110 and the opposite substrate 120 in the non-display area NDA.

Meanwhile, the source electrode SE is connected to the data line DL, and the data line DL is extended to the pad area PA to be connected to the signal input pad SIP. That is, the lower surface of the signal input pad SIP is exposed to the exterior in the pad area PA. Accordingly, the signal input pad SIP is connected to a flexible printed circuit board 140 through the lower surface thereof. The flexible printed circuit board 140 includes a driver IC 141 mounted thereon and connected to the external circuit module.

Hereinafter, a method of manufacturing the display panel will be described with reference to FIGS. 16 to 19.

FIGS. 16 to 19 are cross-sectional views showing a method of manufacturing the display panel shown in FIGS. 14 and 15.

In accordance with one exemplary embodiment, the array substrate 110 is prepared. The array substrate 110 may include the display area DA, the non-display area NDA surrounding the display area DA, and the pad area PA extending from at least one side of the non-display area NDA. The non-display area NDA may include the first non-display area NDA-1 adjacent to the pad area PA and the second non-display area NDA-2 except for the first non-display area NDA-1.

In addition, the array substrate 110 may include the first base substrate 111, a sacrificial layer 119 disposed on the first base substrate 111 in the pad area PA, the thin film transistor TFT disposed on the first base substrate 111 in the display area DA, the protective layer 114 covering the thin film transistor TFT and the sacrificial layer 119, the photosensitive polymer organic layer 116 disposed on the protective layer 114 in the pad area PA, and the pixel electrode 115 connected to the thin film transistor TFT.

Figure 16:
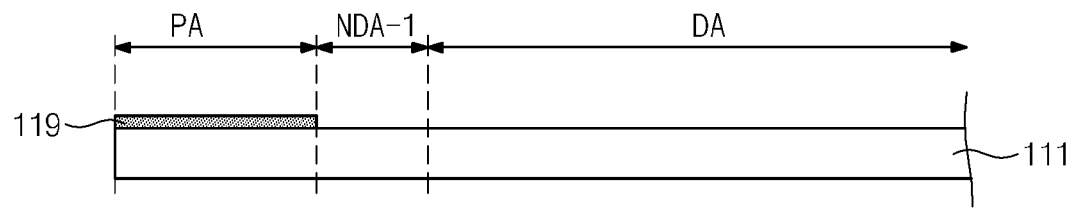
FIGS. 16 to 19 are cross-sectional views showing a method of manufacturing the display panel shown in FIGS. 14 and 15.

Referring to FIG. 16, when the first base substrate 111 is prepared, the sacrificial layer 110 is formed to cover the pad area PA of the first base substrate 111. The sacrificial layer 119 includes a material that is removable, for instance, by a laser beam or any suitable method.

Figure 17:
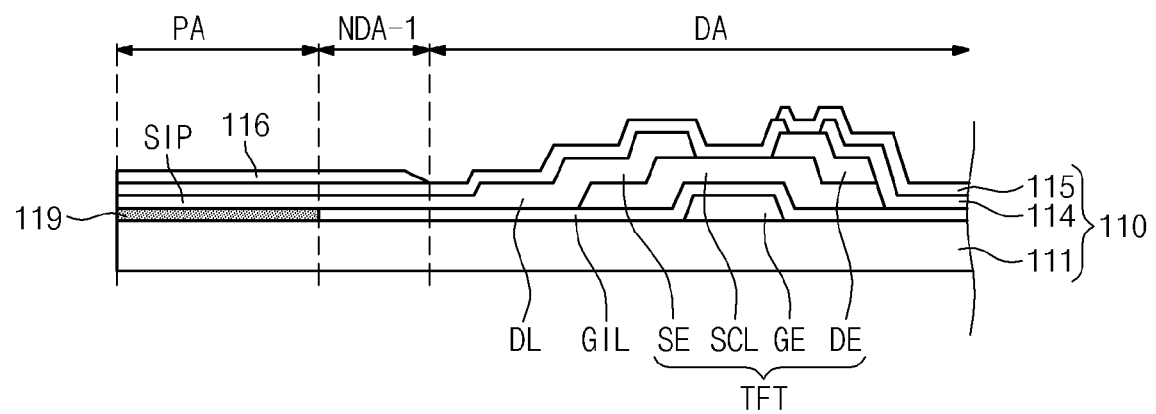

Then, the thin film transistor TFT is formed in the display area DA of the first base substrate 111 as shown in FIG. 17.

To form the thin film transistor TFT, the gate electrode GE is formed on the base substrate 111 and the gate insulating layer GIL is formed to cover the gate electrode GE. Then, the semiconductor layer SCL is formed on the gate insulating layer GIL, and the source and is drain electrodes SE and DE are formed to respectively make contact with the source and drain areas of the semiconductor layer SCL. The channel area is disposed between the source area and the drain area.

In addition, when the source electrode SE and the drain electrode DE are formed, the data line DL electrically connected to the source electrode SE and the signal input pad SIP electrically connected to the data line DL and disposed on the sacrificial layer 119 of the pad area PA are formed.

In accordance with another exemplary example, which is not shown in the figures, an insulating layer may be formed to cover the sacrificial layer 119 and the first base substrate 111 before the thin film transistor TFT is formed. In this case, the signal input pad SIP may be formed on the insulating layer.

After the thin film transistor TFT is formed, the protective layer 114 is formed to cover the thin film transistor TFT.

Then, a photosensitive polymer organic material is coated on the protective layer 114, and the photosensitive polymer organic material is patterned by a photolithography process, and thus the photosensitive polymer organic layer 116 is formed on the first non-display area NDA-1 and the pad area PA. The photosensitive polymer organic layer 116 includes photosensitive polyimide and has a thickness from about 3 micrometers to about 5 micrometers.

In addition, the photosensitive polymer organic layer 116 has a taper shape at the end portion thereof adjacent to the display area DA. The taper angle θ of the end portion may be in a range from about 20 degrees to about 70 degrees, and the width W of the end portion may be in the range from about 3 micrometers to about 15 micrometers.

After that, the protective layer 114 is patterned to expose a portion of the drain electrode DE. Here, the patterned area of the protective layer 114 serves as the contact hole CH.

The pixel electrode 115 is formed on the protective layer 114 and connected to the drain electrode DE through the contact hole CH.

In the present exemplary embodiment, the photosensitive polymer organic layer 116 is formed after the protective layer 114 is formed, but a person of ordinary skill in the art will appreciate that the photosensitive polymer organic layer 116 may be formed after the pixel electrode 115 is formed.

Figure 18:
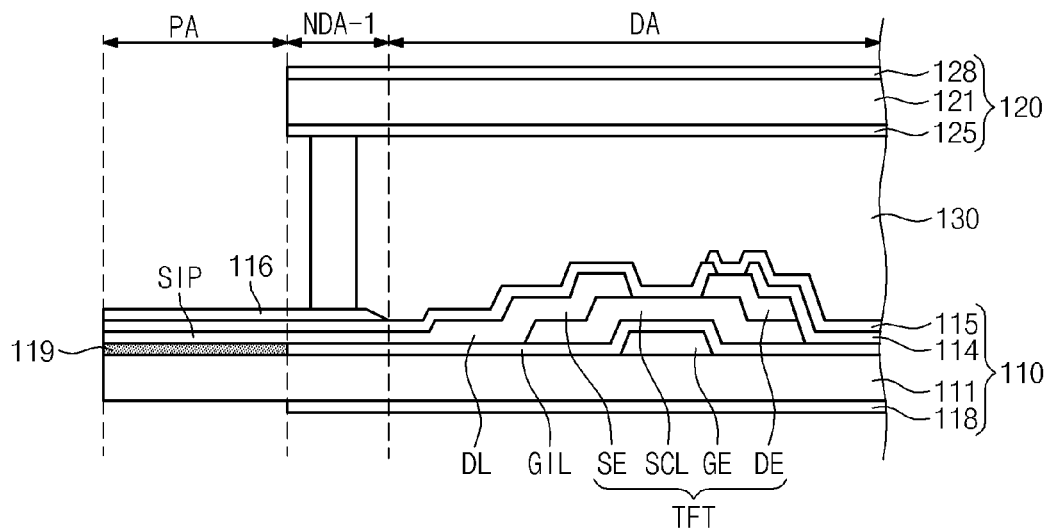

Referring to FIG. 18, the sealant pattern SP is formed in the non-display area NDA of the array substrate 110. The sealant pattern SP may have conductivity and is cured, for instance, by heat or light.

Then, the liquid crystal layer 130 may be formed in the display area DA after the sealant pattern SP.

The opposite substrate 120 including the second base substrate 121 and the common electrode 125 disposed on the second base substrate 121 is prepared, and the opposite substrate 120 is disposed such that the common electrode 125 faces the array substrate 110. The array substrate 110 and the opposite substrate 120 are coupled to each other by the sealant pattern SP.

Next, heat or light is applied to the sealant pattern SP to cure the sealant pattern SP after the array substrate 110 and the opposite substrate 120 are coupled to each other.

Figure 19:
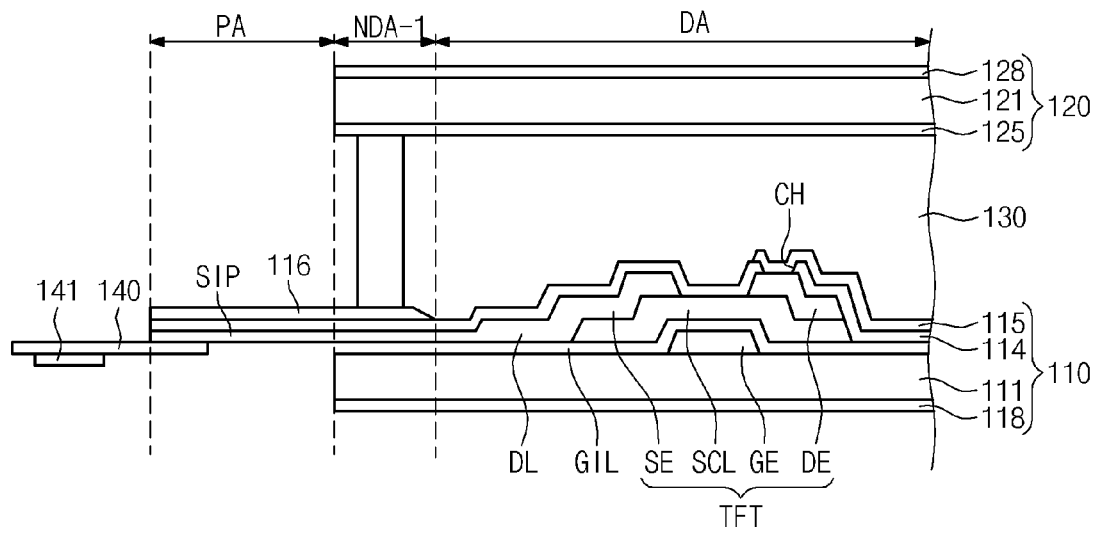

Referring to FIG. 19, when the sealant pattern SP is cured, the first base substrate 111 is removed from the pad area PA using a laser cutting method or a wet etch method. In detail, when the laser is irradiated onto the first base substrate 111, the sacrificial layer 119 is removed by the laser. Accordingly, the lower surface of the signal input pad SIP is exposed to the exterior.

After removing the first base substrate 111 and the sacrificial layer 119 in the pad area PA, the flexible printed circuit board 140 is attached to the lower surface of the signal input pad SIP to electrically connect the signal input pad SIP and the driver IC 141.

Then, the pad area PA is bent toward the backlight unit.

The display panel 100 and the backlight unit are accommodated in the lower and upper covers, and thus the display device is manufactured.

Figure 20:
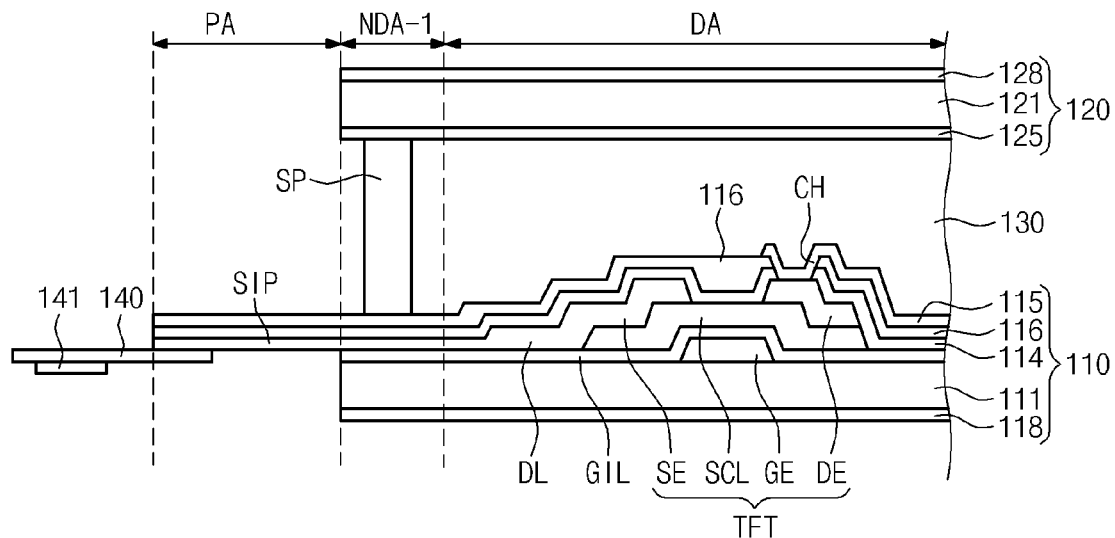
FIG. 20 is a cross-sectional view of a display panel according to another exemplary embodiment of the present disclosure.
Figure 21:
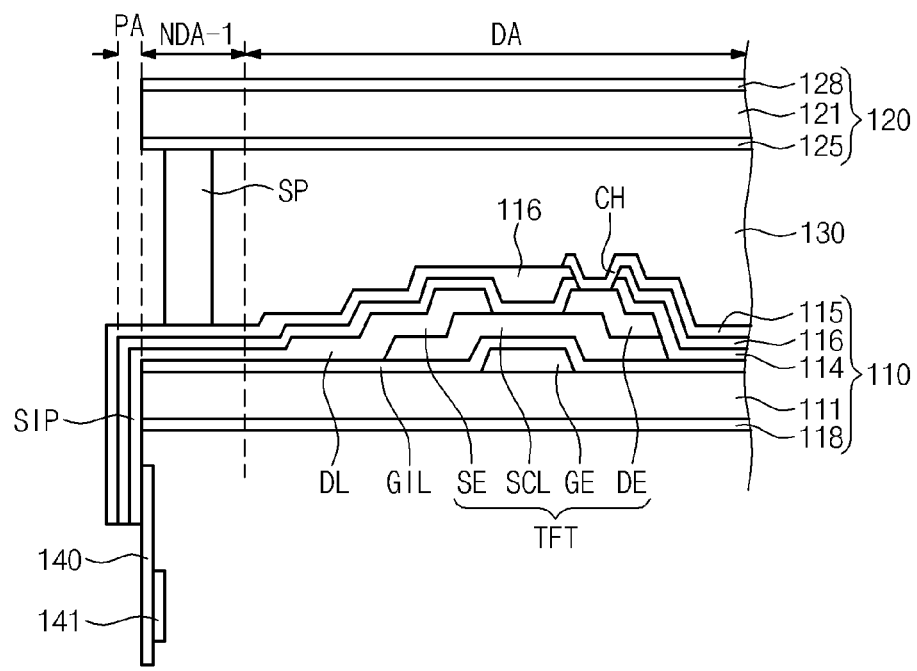
FIG. 21 is a cross-sectional view of a bent shape of a pad area of the display panel shown in FIG. 20.

FIG. 20 is a cross-sectional view of a display panel according to another exemplary embodiment of the present disclosure, and FIG. 21 is a cross-sectional view of the bent shape of the pad area of the display panel shown in FIG. 20.

The display panel shown in FIGS. 20 and 21 is manufactured to have arrangements similar to the display panel shown in FIGS. 14 to 19.

In the present exemplary embodiment, however, the photosensitive polymer organic layer 116 may be formed to extend to the non-display area NDA and the display area DA to cover the entire surface of the array substrate 110.

In detail, the display panel includes an array substrate 110, an opposite substrate 120 facing the array substrate 110, and a liquid crystal layer 130 disposed between the array substrate 110 and the opposite substrate 120.

The array substrate 110 includes the display area DA, the non-display area NDA, and the pad area PA. In addition, the array substrate 110 includes a first base substrate 111, a thin film transistor TFT disposed on the first base substrate 111, a signal input pad SIP electrically connected to the thin film transistor TFT through a data line DL and disposed in the pad area PA, a protective layer 114 covering the thin film transistor TFT, the data line DL, and the signal input pad SIP, the photosensitive polymer organic layer 116 disposed on the protective layer 114, and a pixel electrode 115 disposed on the photosensitive polymer organic layer 116 and connected to the thin film transistor TFT.

The method of manufacturing the array substrate 110 is described as follows.

The protective layer 114 is formed on the first base substrate 111 to cover the thin film transistor TFT, the data line DL, and the signal input pad SIP.

After the protective layer 114 is formed, the photosensitive polymer organic layer 116 is formed over the entire surface of the protective layer 114.

Then, the protective layer 114 and the photosensitive polymer organic layer 116 are substantially simultaneously patterned to form a contact hole CH through which a portion of the drain electrode DE of the thin film transistor TFT is exposed.

When the pixel electrode 115 is formed on the photosensitive polymer organic layer 116 to be connected to the drain electrode DE of the thin film transistor TFT, the array substrate 110 is manufactured.

Thus, no additional process is required to pattern the photosensitive polymer organic layer 116 and thus the process of manufacturing the array substrate 110 may advantageously be simplified.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display panel comprising:
an array substrate comprising a display area, a non-display area outside the display area, and a pad area extending from at least one side of the non-display area, the non-display area comprising a first non-display area adjacent to the pad area and a second non-display area other than the first non-display area;
an opposite substrate facing the array substrate and comprising a second base substrate and a common electrode disposed on the second base substrate; and
a liquid crystal layer disposed between the array substrate and the opposite substrate, wherein the array substrate further comprises:
a first base substrate disposed in the display area and the non-display area;
a photosensitive polymer organic layer disposed in the first non-display area and the pad area, the photosensitive polymer organic layer having an end portion with a taper shape, the photosensitive polymer organic layer entirely overlapped with the pad area;
a thin film transistor disposed on the first base substrate in the display area;
a pixel electrode connected to the thin film transistor; and
a signal input pad connected to the thin film transistor and disposed on the photosensitive polymer organic layer in the pad area.

2. The display panel of claim 1, wherein the photosensitive polymer organic layer is disposed on the first base substrate and has the taper shape at an end portion of the first non-display area.

3. The display panel of claim 2, wherein the photosensitive polymer organic layer has a thickness in a range of about 3 micrometers to about 5 micrometers.

4. The display panel of claim 2, wherein the end portion has a taper angle in a range of about 20 degrees to about 70 degrees.

5. The display panel of claim 2, wherein the end portion has a width in a range of about 3 micrometers to about 15 micrometers.

6. The display panel of claim 2, wherein the photosensitive polymer organic layer has a curvature radius in a range of about 1 micrometer to about 100 micrometers in a bent state.

7. The display panel of claim 2, wherein the photosensitive polymer organic layer comprises a photosensitive polyimide.

8. The display panel of claim 7, wherein the photosensitive polyimide is represented by one of the following formulas,

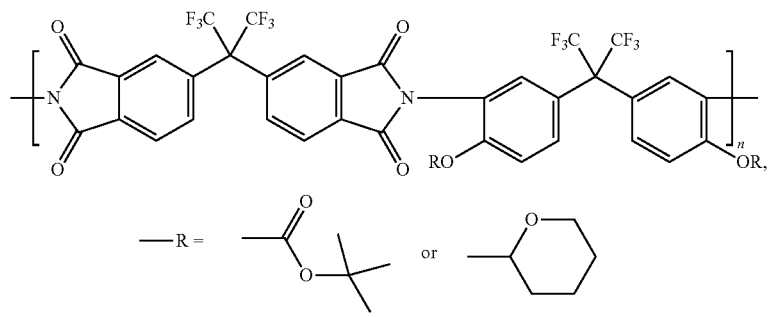
Formula 1
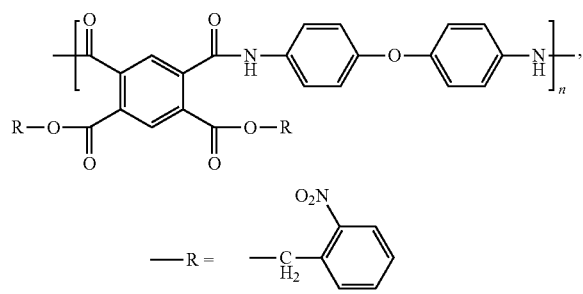
Formula 2
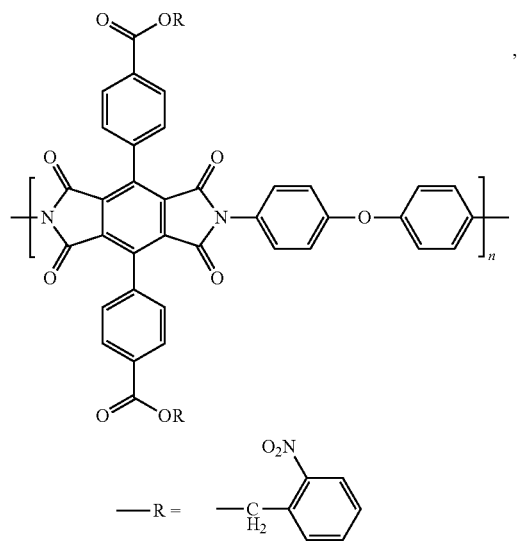
Formula 3
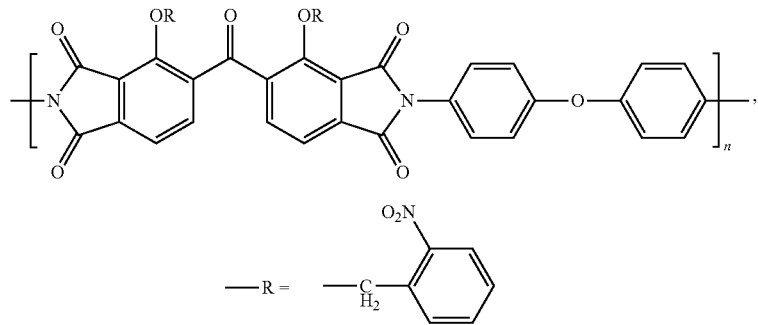
Formula 4
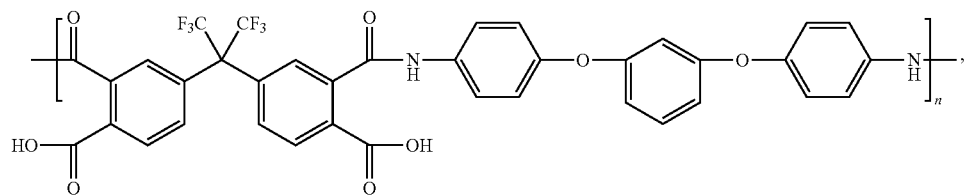
Formula 5

-continued

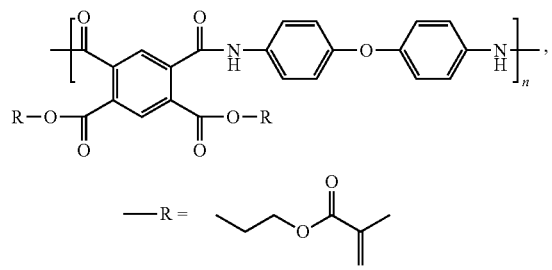
Formula 6

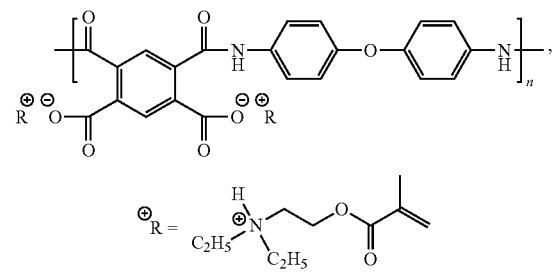
Formula 7

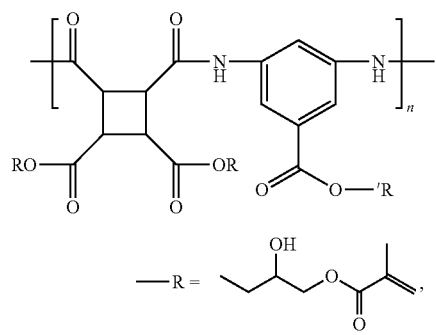
Formula 8

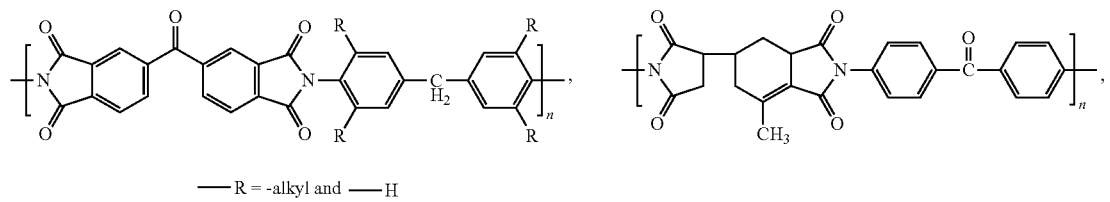

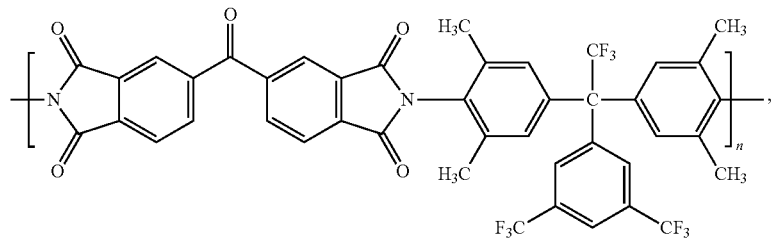
Formula 9

Formula 10

Formula 11 where Formulas 1 to 5 represent a positive-type photosensitive polyimide, and Formulas 6 to 11 represent a negative-type photosensitive polyimide.

9. The display panel of claim 2, further comprising an insulating layer disposed on the photosensitive polymer organic layer and the first base substrate, wherein the thin film transistor is disposed on the insulating layer.

10. The display panel of claim 1, wherein the photosensitive polymer organic layer is disposed on the signal input pad.

11. The display panel of claim 10, wherein the photosensitive polymer organic layer has a thickness in a range of about 3 micrometers to about 5 micrometers.

12. The display panel of claim 10, wherein the end portion has a taper angle in a range of about 20 degrees to about 70 degrees.

13. The display panel of claim 10, wherein the end portion has a width in a range of about 3 micrometers to about 15 micrometers.

14. The display panel of claim 10, wherein the photosensitive polymer organic layer has a curvature radius in a range of about 1 micrometer to about 100 micrometers in a bent state.

* * * * *